United States Patent
Liu et al.

(10) Patent No.: US 12,493,236 B2
(45) Date of Patent: Dec. 9, 2025

(54) METHOD FOR MANUFACTURING PHOTOMASK AND PHOTOMASK

(71) Applicant: Shanghai Huali Microelectronics Corporation, Shanghai (CN)

(72) Inventors: Juan Liu, Shanghai (CN); Shirui Yu, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 740 days.

(21) Appl. No.: 17/893,387

(22) Filed: Aug. 23, 2022

(65) Prior Publication Data

US 2023/0127786 A1   Apr. 27, 2023

(30) Foreign Application Priority Data

Oct. 25, 2021   (CN) .......................... 202111238482.0

(51) Int. Cl.
    *G03F 1/36*   (2012.01)
    *G03F 1/38*   (2012.01)
    *G06F 30/398*   (2020.01)

(52) U.S. Cl.
    CPC .................. *G03F 1/36* (2013.01); *G03F 1/38* (2013.01); *G06F 30/398* (2020.01)

(58) Field of Classification Search
    None
    See application file for complete search history.

(56) References Cited

U.S. PATENT DOCUMENTS 7,305,651 B2 * 12/2007 Cao .......................... G03F 1/36
                                                    716/55

FOREIGN PATENT DOCUMENTS

| CN | 109459910 A | * | 3/2019 | ............. H10D 89/10 |
| CN | 111308852 A | * | 6/2020 | ............... G03F 1/38 |
| CN | 111812940 A | * | 10/2020 | ......... G03F 7/70441 |
| CN | 112099310 A | * | 12/2020 | ............... G03F 1/36 |

* cited by examiner

*Primary Examiner* — Leigh M Garbowski
(74) *Attorney, Agent, or Firm* — Banner & Witcoff, Ltd.

(57) ABSTRACT

The application discloses a method for manufacturing a photomask, firstly determining a main pattern area of a photomask substrate and an auxiliary pattern area around the main pattern area; performing optical intensity simulation on patterns of the main pattern area and the auxiliary pattern area by means of an optical proximity correction (OPC) model, so as to ensure that the pattern of the auxiliary pattern area is not exposed on a photoresist on a wafer and the pattern of the main pattern area is exposed on the photoresist on the wafer during the integrated circuit manufacturing process; screening out a set of auxiliary pattern parameters; and forming the pattern of the main pattern area on the photomask substrate by means of a photomask manufacturing etching process, and forming the pattern of the auxiliary pattern area on the photomask substrate according to the auxiliary pattern parameters. The application also discloses a photomask.

9 Claims, 1 Drawing Sheet

---

A main pattern area of a photomask substrate is determined, and an auxiliary pattern area on the photomask substrate is determined around the main pattern area

↓

Optical intensity simulation is performed on patterns of the main pattern area and the auxiliary pattern area by means of an OPC model, so as to ensure that the pattern of the auxiliary pattern area is not exposed on a photoresist on a wafer during an integrated circuit manufacturing process and ensure that the pattern of the main pattern area is exposed on the photoresist on the wafer during the integrated circuit manufacturing process

↓ a set of parameters of auxiliary pattern dimensions are screened out

↓

The main pattern and the auxiliary pattern meet the requirements of simulation parameters is formed on the photomask substrate in the etching process of a photomask manufacturing.

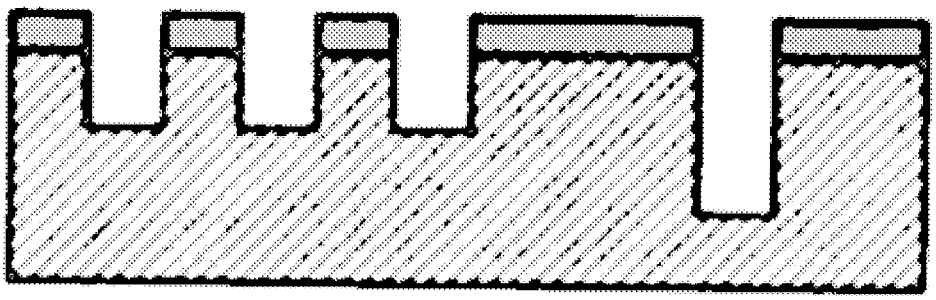

FIG. 1 (Prior Art)

A main pattern area of a photomask substrate is determined, and an auxiliary pattern area on the photomask substrate is determined around the main pattern area

Optical intensity simulation is performed on patterns of the main pattern area and the auxiliary pattern area by means of an OPC model, so as to ensure that the pattern of the auxiliary pattern area is not exposed on a photoresist on a wafer during an integrated circuit manufacturing process and ensure that the pattern of the main pattern area is exposed on the photoresist on the wafer during the integrated circuit manufacturing process

a set of parameters of auxiliary pattern dimensions are screened out

The main pattern and the auxiliary pattern meet the requirements of simulation parameters is formed on the photomask substrate in the etching process of a photomask manufacturing.

FIG. 2

METHOD FOR MANUFACTURING PHOTOMASK AND PHOTOMASK

CROSS-REFERENCES TO RELATED APPLICATIONS

This application claims the priority to Chinese patent application No. 202111238482.0, filed on Oct. 25, 2021, the disclosure of which is incorporated herein by reference in its entirety.

TECHNICAL FIELD

The present application relates to semiconductor manufacturing technologies, in particular to a method for manufacturing a photomask (also referred to as mask) and a photomask.

BACKGROUND

The main pattern on a photomask is used for transfer to a wafer. The inventor found that, when the photomask has a relatively large non-pattern area (the length and width of the non-pattern area both exceed 20 times the critical dimension X of the pattern of the main pattern area), during exposure with laser beams (electron beams) and etching for forming a pattern on the photomask, the dimension of the pattern of the main pattern area adjacent to the non-pattern area is increased, leading to relatively poor critical dimension uniformity of patterns at different positions of the main pattern area on the photomask.

In the high-grade photomask manufacturing process required by the advanced integrated circuit manufacturing process, due to a small critical dimension of a lithography pattern under the advanced integrated circuit manufacturing process, the critical dimension variation (CD spec) allowed by a pattern, which is to be transferred to a photoresist on a wafer, on a photomask, which is made by the high-grade photomask manufacturing process, is reduced accordingly. In the integrated circuit manufacturing process, with the reduction of the technology node (reduction of the critical dimension), when the pattern dimension is reduced to be close to the limit of lithography capability, a great challenge is imposed to the photomask manufacturing process. As one of the criteria to evaluate the quality of the photomask, the critical dimension uniformity of patterns at different positions on the photomask is particularly important.

Generally, the critical dimension uniformity of patterns at different positions of the main pattern area on the photomask is improved by optimizing the photomask manufacturing etching process. However, relying solely on photomask manufacturers adjusting the photomask manufacturing etching process cannot quickly and effectively solve the problem of a loading difference caused by the existence of the large non-pattern area on the photomask, making it difficult to quickly and effectively solve the technical problem of poor uniformity of patterns at different positions of the main pattern area on the photomask.

The etch loading effect is an etch rate drop or distribution unevenness effect caused by local consumption of an etching gas being greater than the supply. The loading effect can be classified into three types: macroloading, microloading, and aspect ratio dependent etching (ARDE). The macroloading refers to a decrease in the overall etch rate due to an increase in total etching area. When the etching area occupies only 1% of the total area of a sample, the silicon etch rate can reach up to 50 μm/min. However, when the etching area occupies 20% of the total area of the sample, the maximum etch rate can reach only 30 μm/min, making it very difficult to control the etch rate, as the same etching process parameter may result in different etching depths for different design patterns. The microloading refers to a difference in the etch rate caused by a difference in the pattern density within the same design pattern. In an area with dense patterns, active components of reactive ions are consumed quickly, leading to an imbalance between consumption and supply and a decrease in the etch rate. As a result, the etching depth of the area with dense patterns is less than that of an area with sparse patterns, leading to an uneven distribution of the overall etching depth of the sample, as shown in FIG. 1. The aspect ratio dependent etching (ARDE) is mainly represented by different etching depths of patterns with different dimensions on the same substrate. That is, a wide pattern has a larger etching depth and a narrow pattern has a smaller etching depth, because the update of effective reactive components on the etched surface of a structure with a high aspect ratio becomes increasingly difficult as the etching depth increases. For a success in etching, volatile components generated by the etching are necessarily discharged from a deep groove or deep hole, and sufficient effective reactive components necessarily enter the deep groove or deep hole to replenish the consumed part. Therefore, the aspect ratio dependent etching (ARDE) is also referred to as RIE lag or aperture effect. Some other mechanisms are used to explain the ARDE phenomenon. Some problems regarding uniformity are due to the relation of the etch rate and etch profile to the pattern dimension and density. The etch rate is relatively slow in a small window pattern, and the etching even stops in a small-dimension pattern with a high aspect ratio. In order to improve the uniformity, the ARDE effect on the wafer surface is necessarily minimized. The loading effect can be described by the following formula:

$$R = \frac{R_0}{1+KA},$$

wherein $R_0$ is the cavity etch rate, A is the exposed area of a film to be etched, and k is a constant which can usually be reduced by fixing the reactor pressure and increasing the flow rate of the etching gas.

In the research and development stage, before manufacturing a high-grade photomask of small critical dimension special pattern, the photomask manufacturer needs to constantly adjust the photomask manufacturing process and the model predictive control (MPC) model. Therefore, optical proximity correction (OPC) is required in the stage of evaluation and verification of the quality of the photomask, until the photomask manufacturing process is optimized, thereby improving the critical dimension uniformity (CD uniformity) on the wafer.

BRIEF SUMMARY

The technical problem to be solved by the present application is how to more efficiently improve the critical dimension uniformity of patterns at different positions of a main pattern area on a photomask.

In order to solve the above technical problem, a method for manufacturing a photomask provided by the present application includes the following steps:

step 1, determining a main pattern area of a photomask substrate, and determining an auxiliary pattern area on the photomask substrate around the main pattern area;

step 2, performing optical intensity simulation on patterns of the main pattern area and the auxiliary pattern area by means of an OPC model, so as to ensure that the pattern of the auxiliary pattern area is not exposed on a photoresist on a wafer during an integrated circuit manufacturing process and ensure that the pattern of the main pattern area is exposed on the photoresist on the wafer during the integrated circuit manufacturing process;

step 3, screening out a set of parameters of auxiliary pattern dimensions;

step 4, forming the pattern of the main pattern area on the photomask substrate by means of a photomask manufacturing etching process, and forming the pattern of the auxiliary pattern area on the photomask substrate according to the auxiliary pattern parameters.

In some examples, in step 3, according to a principle of ensuring that the main pattern formed in the main pattern area of the photomask substrate is safest, the set of auxiliary pattern parameters are screened out.

In some examples, in step 3, for a case where a pattern area has a dark tone in a negative tone develop process, when the intensity of light causes the formation of the main pattern in the main pattern area of the photomask substrate and makes Lh-Ls Largest, the main pattern in the main pattern area of the photomask substrate is safest, wherein Lh is a critical threshold of optical intensity required to form exactly target critical dimensions of main pattern during exposure, and Ls is the intensity of light irradiating the auxiliary pattern area of the photomask substrate.

In some examples, in step 4, an OPC recipe is optimized, then the pattern of the main pattern area is formed on the photomask substrate by means of the photomask manufacturing etching process, and the pattern of the auxiliary pattern area is formed on the photomask substrate according to the auxiliary pattern parameters.

In some examples, the set of auxiliary pattern parameters include the length of a line pattern of the auxiliary pattern area, the width of the line pattern, the space between the line patterns in the length direction, and the space between the line patterns in the width direction.

In some examples, the direction of a line pattern of the auxiliary pattern area is perpendicular to the direction of a line pattern of the main pattern area.

In some examples, the critical dimension of the auxiliary pattern area is less than ⅓ of the critical dimension of the main pattern area.

In some examples, the auxiliary pattern area is rectangular, and the length and width thereof both exceed 20 times the critical dimension X of the pattern of the main pattern area.

In some examples, an interval between the auxiliary pattern area and the main pattern area is 5-10 times the critical dimension X of the pattern of the main pattern area.

In some examples, the critical dimension of the main pattern area is 35 nm-80 nm;
 the critical dimension of the auxiliary pattern area is 10 nm-20 nm; and
 an interval between the auxiliary pattern area and the main pattern area is 180 nm-300 nm.

In some examples, the length*width of a line pattern of the auxiliary pattern area is 10 nm*150 nm, 15 nm*300 nm, or 20 nm*150 nm.

A photomask manufactured by the manufacturing method includes a main pattern area and an auxiliary pattern area.

The auxiliary pattern area is located around the main pattern area.

The critical dimension of a pattern of the auxiliary pattern area is less than the critical dimension of a pattern of the main pattern area.

The pattern of the main pattern area can be transferred to a photoresist on a wafer during an integrated circuit manufacturing process.

The pattern of the auxiliary pattern area cannot be transferred to the photoresist on the wafer during the integrated circuit manufacturing process.

In some examples, the critical dimension of the auxiliary pattern area is less than ⅓ of the critical dimension of the main pattern area.

In some examples, the direction of a line pattern of the auxiliary pattern area is perpendicular to the direction of a line pattern of the main pattern area.

In some examples, the auxiliary pattern area is rectangular, and the length and width thereof both exceed 20 times the critical dimension X of the pattern of the main pattern area.

In some examples, an interval between the auxiliary pattern area and the main pattern area is 5-10 times the critical dimension X of the pattern of the main pattern area.

In some examples, the critical dimension of the main pattern area is 35 nm-80 nm.

The critical dimension of the auxiliary pattern area is 10 nm-20 nm.

An interval between the auxiliary pattern area and the main pattern area is 180 nm-300 nm.

A line pattern of the auxiliary pattern area is 10 nm*150 nm, 15 nm*300 nm, or 20 nm*150 nm.

In the method for manufacturing a photomask of the present application, the auxiliary pattern area is designed in a large area around the main pattern area of the photomask substrate that does not require pattern transfer. A series of micro-dimension patterns are designed in the auxiliary pattern area to alleviate the loading effect of photomask manufacturing etching process, so as to more achieve the critical dimension uniformity (CD uniformity) of patterns at different positions of the main pattern area on the photomask. Compared with a method of relying solely on photomask manufacturers adjusting the manufacturing etching process in the development stage, the method for manufacturing a photomask can more efficiently improve the critical dimension uniformity of patterns at different positions of the main pattern area on the photomask.

BRIEF DESCRIPTION OF THE DRAWINGS

In order to more clearly explain the technical solutions of the present application, the drawings required by present application are briefly described below. It is obvious that the drawings described below are merely some embodiments of the present application, and those skilled in the art could also obtain other drawings on the basis of these drawings, without involving any inventive skill.

FIG. 1 is a schematic diagram of microloading.

FIG. 2 is a flowchart of a method for manufacturing a photomask according to an embodiment of the present application.

DETAILED DESCRIPTION OF THE DISCLOSURE

The technical solutions of the present application will be clearly and completely described below with reference to the drawings. Obviously, the described embodiments are part of the embodiments of the present application, rather than all of them. Based on the embodiments in the present application, all other embodiments obtained by those skilled in the art without involving any inventive skill shall fall into the protection scope of the present application.

Embodiment 1

Referring to FIG. 2, a method for manufacturing a photomask includes the following steps:

Step 1. A main pattern area of a photomask substrate is determined, and an auxiliary pattern area on the photomask substrate is determined around the main pattern area.

Step 2. Optical intensity simulation is performed on patterns of the main pattern area and the auxiliary pattern area by means of an OPC (optical proximity correction) model, so as to ensure that the pattern of the auxiliary pattern area is not exposed on a photoresist on a wafer during an integrated circuit manufacturing process and ensure that the pattern of the main pattern area is exposed on the photoresist on the wafer during the integrated circuit manufacturing process.

Step 3. A set of parameters of auxiliary pattern dimensions are screened out.

Step 4. The pattern of the main pattern area is formed on the photomask substrate by means of a photomask manufacturing etching process, and the pattern of the auxiliary pattern area is formed on the photomask substrate according to the auxiliary pattern parameters.

In some examples, in step 3, according to a principle of ensuring that the main pattern formed in the main pattern area of the photomask substrate is safest (for a case where a pattern area has a dark tone in a negative tone develop (NTD) process, when the intensity of light causes the formation of the main pattern in the main pattern area of the photomask substrate and makes Lh-Ls Largest, the main pattern in the main pattern area of the photomask substrate is safest, wherein Lh is a critical threshold of optical intensity required to form exactly target critical dimensions of main pattern during exposure, and Ls is the intensity of light irradiating the auxiliary pattern area of the photomask substrate), the set of auxiliary pattern parameters are screened out.

In some examples, in step 4, an OPC recipe is optimized, then the pattern of the main pattern area is formed on the photomask substrate by means of the photomask manufacturing etching process, and the pattern of the auxiliary pattern area is formed on the photomask substrate according to the auxiliary pattern parameters.

In the method for manufacturing a photomask of embodiment 1, the auxiliary pattern area is designed in a large area around the main pattern area of the photomask substrate that does not require pattern transfer. A series of micro-dimension patterns are designed in the auxiliary pattern area to alleviate the loading effect of photomask manufacturing etching process, so as to achieve the critical dimension uniformity (CD uniformity) of patterns at different positions of the main pattern area on the photomask. Compared with a method of relying solely on photomask manufacturers adjusting the manufacturing etching process in the development stage, the method for manufacturing a photomask of embodiment 1 can more efficiently improve the critical dimension uniformity of patterns at different positions of the main pattern area on the photomask.

Embodiment 2

Based on the method for manufacturing a photomask of embodiment 1, the set of auxiliary pattern parameters include the length of a line pattern of the auxiliary pattern area, the width of the line pattern, an interval between the line patterns in the length direction, and an interval between the line patterns in the width direction, etc.

Embodiment 3

Based on the method for manufacturing a photomask of embodiment 1, the direction of a line pattern of the auxiliary pattern area is perpendicular to the direction of a line pattern of the main pattern area.

As the direction of the line pattern of the auxiliary pattern area is perpendicular to the direction of the line pattern of the main pattern area, so as to more effectively avoid an increase in the dimension of the pattern of the main pattern area adjacent to the auxiliary pattern area (non-pattern area) during exposure with laser beams (electron beams) and etching for forming a pattern on the photomask, thereby better improving the critical dimension uniformity of patterns at different positions of the main pattern area on the photomask.

Embodiment 4

Based on the method for manufacturing a photomask of embodiment 1, the critical dimension of the auxiliary pattern area is less than ⅓ of the critical dimension of the main pattern area.

Embodiment 5

Based on the method for manufacturing a photomask of embodiment 1, the auxiliary pattern area is rectangular, and the length and width thereof both exceed 20 times the critical dimension X of the pattern of the main pattern area.

In some examples, an interval between the auxiliary pattern area and the main pattern area is 5-10 times the critical dimension X of the pattern of the main pattern area.

In some examples, the critical dimension of the main pattern area is 35 nm-80 nm;
the critical dimension of the auxiliary pattern area is 10 nm-20 nm; and
an interval between the auxiliary pattern area and the main pattern area is 180 nm-300 nm.

In some examples, the length*width of a line pattern of the auxiliary pattern area is 10 nm*150 nm, 15 nm*300 nm, or 20 nm*150 nm.

Embodiment 6

A photomask manufactured by the manufacturing method of embodiment 1 or 2 includes a main pattern area and an auxiliary pattern area.

The auxiliary pattern area is located around the main pattern area.

The critical dimension of a pattern of the auxiliary pattern area is less than the critical dimension of a pattern of the main pattern area.

The pattern of the main pattern area can be transferred to a photoresist on a wafer during an integrated circuit manufacturing process.

The pattern of the auxiliary pattern area cannot be transferred to the photoresist on the wafer during the integrated circuit manufacturing process.

In the photomask of embodiment 6, not only the main pattern area with the pattern that can be transferred to the photoresist on the wafer during the integrated circuit manufacturing process is designed, the auxiliary pattern area with the pattern that cannot be transferred to the photoresist on the wafer during the integrated circuit manufacturing process is also designed on the side of the main pattern area, so that micro patterns are formed in the area with relatively low pattern density on the photomask, increasing the pattern density of the area on the periphery of the main pattern area. Therefore, during the photomask manufacturing etching process for manufacturing the photomask, the loading effect of the photomask manufacturing etching process can be alleviated. Under the premise of ensuring that the auxiliary pattern area will not be exposed on the photoresist on the wafer, the uniformity of patterns at different positions of the main pattern area on the photomask is improved, achieving the critical dimension uniformity (CD uniformity) of the main pattern area of the photomask, and thereby solving the problem of a difficult photomask manufacturing process under the small node (small critical dimension).

Embodiment 7

Based on the photomask of embodiment 6, the direction of a line pattern of the auxiliary pattern area is perpendicular to the direction of a line pattern of the main pattern area.

In some examples, the critical dimension of the auxiliary pattern area is less than ⅓ of the critical dimension of the main pattern area.

In some examples, the auxiliary pattern area is rectangular, and the length and width thereof both exceed 20 times the critical dimension X of the pattern of the main pattern area.

In some examples, an interval between the auxiliary pattern area and the main pattern area is 5-10 times the critical dimension X of the pattern of the main pattern area.

In some examples, the critical dimension of the main pattern area is 35 nm-80 nm.

The critical dimension of the auxiliary pattern area is 10 nm-20 nm.

An interval between the auxiliary pattern area and the main pattern area is 180 nm-300 nm.

A line pattern of the auxiliary pattern area is 10 nm*150 nm, 15 nm*300 nm, or 20 nm*150 nm.

Only some embodiments of the present application are described above, and are not intended to limit the present application. Any modifications, equivalent replacements, improvements, etc. made within the spirit and principles of the present application shall be included in the scope of protection of the present application.

What is claimed is:

1. A method for manufacturing a photomask, comprising the following steps:
    step 1, determining a main pattern area of a photomask substrate, and determining an auxiliary pattern area on the photomask substrate around the main pattern area;
    step 2, performing optical intensity simulation on patterns of the main pattern area and the auxiliary pattern area by means of an optical proximity correction (OPC) model, so as to ensure that the pattern of the auxiliary pattern area is not exposed on a photoresist on a wafer during an integrated circuit manufacturing process and ensure that the pattern of the main pattern area is exposed on the photoresist on the wafer during the integrated circuit manufacturing process;
    step 3, according to a principle wherein for a case where a pattern area has a dark tone in a negative tone develop process, when an intensity of light causes formation of a main pattern in the main pattern area of the photomask substrate and makes a largest difference between a critical threshold of an optical intensity required to form exactly target critical dimensions of the main pattern during exposure and an intensity of light irradiating the auxiliary pattern area of the photomask substrate, screening out a set of parameters of auxiliary pattern dimensions; and
    step 4, forming the pattern of the main pattern area on the photomask substrate by means of a photomask manufacturing etching process, and forming the pattern of the auxiliary pattern area on the photomask substrate according to the set of the parameters of the auxiliary pattern dimensions.

2. The method for manufacturing the photomask according to claim 1, wherein:
    in step 4, an OPC recipe is optimized, then the pattern of the main pattern area is formed on the photomask substrate by means of the photomask manufacturing etching process, and the pattern of the auxiliary pattern area is formed on the photomask substrate according to the set of the parameters of the auxiliary pattern dimensions.

3. The method for manufacturing the photomask according to claim 1, wherein:
    the set of the parameters of the auxiliary pattern dimensions comprises a length of a line pattern of the auxiliary pattern area, a width of the line pattern, an interval between line patterns in a length direction, and an interval between line patterns in a width direction.

4. The method for manufacturing the photomask according to claim 1, wherein:
    a direction of a line pattern of the auxiliary pattern area is perpendicular to a direction of a line pattern of the main pattern area.

5. The method for manufacturing the photomask according to claim 1, wherein:
    a critical dimension of the auxiliary pattern area is less than ⅓ of a critical dimension of the main pattern area.

6. The method for manufacturing the photomask according to claim 1, wherein:
    the auxiliary pattern area is rectangular, and a length and width thereof both exceed 20 times a critical dimension of the pattern of the main pattern area.

7. The method for manufacturing the photomask according to claim 1, wherein:
    an interval between the auxiliary pattern area and the main pattern area is 5-10 times a critical dimension of the pattern of the main pattern area.

8. The method for manufacturing the photomask according to claim 1, wherein:
    a critical dimension of the main pattern area is 35 nm-80 nm;
    a critical dimension of the auxiliary pattern area is 10 nm-20 nm; and
    an interval between the auxiliary pattern area and the main pattern area is 180 nm-300 nm.

9. The method for manufacturing the photomask according to claim 1, wherein:
    a length*width of a line pattern of the auxiliary pattern area is 10 nm*150 nm, 15 nm*300 nm, or 20 nm*150 nm.

* * * * *